(12) United States Patent
Saegusa

(10) Patent No.: US 11,145,584 B2
(45) Date of Patent: Oct. 12, 2021

(54) SEMICONDUCTOR DEVICE, LEAD FRAME, AND METHOD FOR MANUFACTURING SEMICONDUCTOR DEVICE

(71) Applicant: FUJI ELECTRIC CO., LTD., Kawasaki (JP)

(72) Inventor: Naoki Saegusa, Kawasaki (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 0 days.

(21) Appl. No.: 16/394,895

(22) Filed: Apr. 25, 2019

(65) Prior Publication Data

US 2019/0385942 A1    Dec. 19, 2019

(30) Foreign Application Priority Data

Jun. 14, 2018  (JP) .............................. JP2018-113685

(51) Int. Cl.
*H01L 23/498* (2006.01)
*H01L 21/48* (2006.01)

(52) U.S. Cl.
CPC .... *H01L 23/49822* (2013.01); *H01L 21/4821* (2013.01); *H01L 23/49811* (2013.01); *H01L 23/49844* (2013.01)

(58) Field of Classification Search
CPC ......... H01L 23/49822; H01L 23/49811; H01L 23/49855; H01L 23/3121; H01L 21/4821
See application file for complete search history.

(56) References Cited

U.S. PATENT DOCUMENTS

| | | | | |
|---|---|---|---|---|
| 5,793,099 | A * | 8/1998 | Murakami | .......... H01L 23/3107 257/666 |
| 7,449,370 | B2 * | 11/2008 | Tanaka | .............. H01L 23/49562 257/672 |
| 9,691,692 | B2 | 6/2017 | Miyakoshi | |
| 9,966,327 | B2 | 5/2018 | Kamiyama et al. | |
| 2002/0140062 | A1 * | 10/2002 | Oida | .................... H01L 23/3121 257/668 |
| 2003/0020148 | A1 * | 1/2003 | Kiyohara | .......... H01L 23/49544 257/666 |
| 2004/0256742 | A1 * | 12/2004 | Usui | ................. H01L 23/49575 257/787 |
| 2009/0130996 | A1 * | 5/2009 | Kudaishi | ................. H01L 24/48 455/90.3 |
| 2016/0027721 | A1 * | 1/2016 | Lee | ......................... H01L 24/97 174/261 |

(Continued)

FOREIGN PATENT DOCUMENTS

JP  2016/084483 A1  6/2016
JP  2017-5094 A  1/2017

*Primary Examiner* — Nathan W Ha

(57) ABSTRACT

Provided is a semiconductor device that can improve yield and non-defective rate by obtaining the thickness of a melt-bonding material and suppressing inclination of a circuit board. The semiconductor device includes a circuit board including a circuit pattern layer, a semiconductor element mounted on the circuit board, a melt-bonding portion arranged on an upper surface of the circuit pattern layer, a bonding lead including a bonding portion facing the upper surface of the circuit pattern layer and electrically connected to the circuit pattern layer via the melt-bonding portion, and a pressing portion directly contacted with an upper surface of the circuit board.

16 Claims, 9 Drawing Sheets

(56) References Cited

U.S. PATENT DOCUMENTS

| | | |
|---|---|---|
| 2016/0043811 A1* | 2/2016 | Yaginuma ............... H01L 24/97 |
| | | 257/82 |
| 2016/0365307 A1 | 12/2016 | Miyakoshi |
| 2017/0025331 A1 | 1/2017 | Kamiyama et al. |
| 2017/0221799 A1* | 8/2017 | Chang ............... H01L 23/49575 |
| 2017/0345742 A1* | 11/2017 | Sakamoto ........... H01L 23/4952 |
| 2018/0040540 A1* | 2/2018 | Kasuya ............. H01L 23/49568 |
| 2018/0090419 A1* | 3/2018 | Ho .................... H01L 23/49555 |
| 2018/0261731 A1* | 9/2018 | Wojcik ................ H01S 5/02296 |
| 2020/0135381 A1* | 4/2020 | Yan ....................... H01L 23/495 |
| 2020/0251409 A1* | 8/2020 | Saito ................ H01L 23/49541 |
| 2020/0258820 A1* | 8/2020 | Ko ........................ H01L 23/645 |
| 2020/0273781 A1* | 8/2020 | Scharf ................ H01L 23/3107 |
| 2020/0312750 A1* | 10/2020 | Shirai ............... H01L 23/49562 |
| 2020/0321228 A1* | 10/2020 | Hosokawa ............. H01L 25/00 |

* cited by examiner

SEMICONDUCTOR DEVICE, LEAD FRAME, AND METHOD FOR MANUFACTURING SEMICONDUCTOR DEVICE

CROSS REFERENCE TO RELATED APPLICATIONS AND INCORPORATION BY REFERENCE

This application claims benefit of priority under 35 USC 119 based on Japanese Patent Application No. 2018-113685 filed on Jun. 14, 2018, the entire contents of which are incorporated by reference herein.

TECHNICAL FIELD

The present invention relates to a semiconductor device, a lead frame for use in mounting the semiconductor device, and a method for manufacturing a semiconductor device using the lead frame.

BACKGROUND ART

It is known that lead frames are used for electrical wiring of a power module including semiconductor elements and the like. A lead frame is used to mount a circuit board, semiconductor elements, and the like by a melt-bonding material and wire bonding, and connect the semiconductor elements and the like to an external circuit. The circuit board is sealed with a resin such as epoxy, except for the lead frame and a surface of the circuit board on a side opposite to a surface thereof where the semiconductor elements are mounted.

WO 2016/084483 discloses a technology for preventing a melt-bonding material for bonding together a lead frame and a wiring board from forming cracks due to temperature change. In the technology of WO 2016/084483, peripheral edges of terminal portions of the lead frame where stress concentration tends to occur are formed to be thinner than center regions thereof to obtain the thickness of a solder layer as the melt-bonding material. In this manner, it is necessary for the melt-bonding material between the lead frame and the circuit board to have a predetermined thickness in order to have resistance against thermal stress.

On the other hand, as a result of miniaturization and weight reduction of the circuit board due to cost reduction, paste (solder paste) as the melt-bonding material is wet-mounted onto side face(s) of the lead frame during a reflow process of the paste. Then, surface tension may pull up the circuit board toward a bonding target. Due to this, the melt-bonding material may not be able to have enough thickness, or the circuit board may be inclined. When the circuit board is inclined at the time of resin transfer molding, burrs (flashes) can be formed.

SUMMARY OF INVENTION

In view of the above problems, it is an object of the present invention to provide a semiconductor device, a lead frame, and a method for manufacturing a semiconductor device in which the thickness of a melt-bonding material such as solder can be easily obtained, and inclination of a circuit board is suppressed, thereby enabling improvement in yield.

In order to achieve the object mentioned above, according to a first aspect of the present invention, there is provided a semiconductor device including: (a) a circuit board including a circuit pattern layer; (b) a semiconductor element mounted on the circuit pattern layer; (c) a melt-bonding material arranged on a part of an upper surface of the circuit pattern layer; and (d) a connection terminal group formed by including a plurality of leads including a bonding portion electrically connected to the circuit pattern layer via the melt-bonding material and a pressing portion mechanically contacted with an upper surface of the circuit board.

According to a second aspect of the present invention, there is provided (a) a lead frame to be bonded to a circuit board including a circuit pattern layer, the lead frame including: (b) a connection terminal group formed by including a plurality of leads including a bonding portion to be electrically connected to the circuit pattern layer via a melt-bonding material and a pressing portion to be mechanically contacted with an upper surface of the circuit board; and (c) a frame portion configured to support the connection terminal group. The lead frame according to the second embodiment, in the connection terminal group, the plurality of leads are adjusted in shape such that when the pressing portion is in contact with the upper surface of the circuit board, there is a gap between the bonding portion and the circuit pattern layer.

According to a third aspect of the present invention, there is provided a method for manufacturing a semiconductor device including: (a) preparing a circuit board including a circuit pattern layer; (b) mounting a semiconductor element on the circuit board; (c) applying a melt-bonding material on an upper surface of the circuit pattern layer; (d) arranging, above the circuit board, a lead frame including a connection terminal group formed by including a plurality of leads including a bonding portion to be electrically connected to the circuit pattern layer via the melt-bonding material and a pressing portion to be mechanically contacted with an upper surface of the circuit board; (e) arranging the lead frame such that the pressing portion presses the circuit board to forma gap between the bonding portion and the circuit pattern layer; and (f) melting the melt-bonding material.

According to the present invention, it is possible to provide a semiconductor device, a lead frame, and a method for manufacturing a semiconductor device in which the thickness of a melt-bonding material such as solder can be easily obtained, and inclination of a circuit board is suppressed, thereby enabling improvement in yield.

DETAILED DESCRIPTION

Hereinafter, embodiments of the present invention will be described with reference to the drawings. In the description of the drawings, the same or similar portions are assigned the same or similar reference signs, without redundant description. However, the drawings are schematic, and it should be noted that a relationship between a thickness and a planar dimension, a ratio of a thickness of each of layers, and the like are different from actual values. Moreover, it is possible that portions different in mutual dimensional relationships and ratios are shared also among the drawings.

Further, the embodiments as described below are to illustrate a device or a method for embodying the technical idea of the present invention, and the technical idea of the present invention is not to specify a material, a shape, a configuration, a disposition, and the like of a constituting component as those described below.

Additionally, definitions of upper, lower, and other directions in the following description are only for the convenience of illustration, and do not limit the technological concept of the present invention. For example, when a target is rotated by 90 degrees and observed, the upper and lower directions are obviously replaced by right and left directions, and when rotated by 180 degrees and observed, the upper and lower directions are obviously reversed.

First Embodiment

Figure 1:
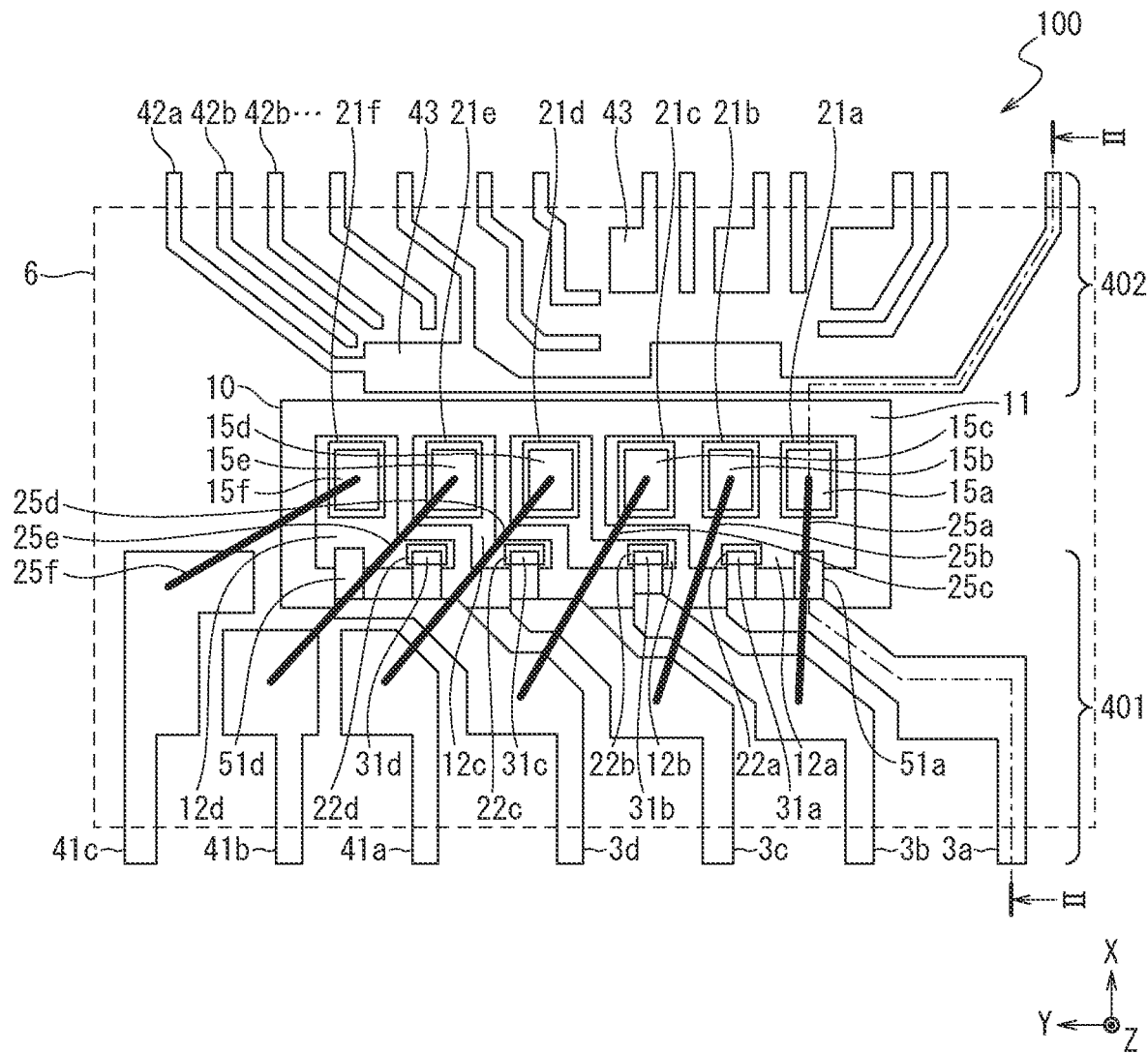
FIG. 1 is a plan view illustrative of a basic structure of a semiconductor device according to a first embodiment of the present invention.
Figure 2:
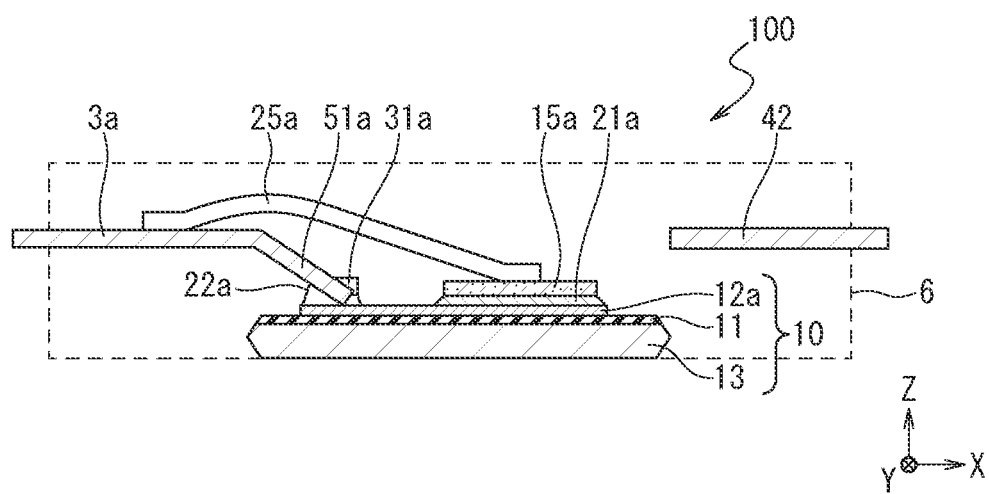
FIG. 2 is a cross-sectional view of a first bonding lead as seen from direction II-II of FIG. 1.

As illustrated in FIG. 1 and FIG. 2, a semiconductor device 100 according to a first embodiment of the present invention includes a circuit board 10, a plurality of first to sixth semiconductor elements 15a to 15f, and a connection terminal group (401, 402). The semiconductor device 100 may include a seal resin 6. The circuit board 10 is mounted with the plurality of first to sixth semiconductor elements 15a to 15f on an upper surface thereof. The first to sixth semiconductor elements 15a to 15f are elements in which inner active regions form pn bonding to control main current flow. The connection terminal group (401, 402) includes a plurality of connection terminals (leads) to be connected to the circuit board 10, the first to sixth semiconductor elements 15a to 15f, and the like. The seal resin 6 seals an upper surface of the circuit board 10, respective partial portions of the first to sixth semiconductor elements 15a to 15f, and the connection terminal group (401, 402), and the like. The semiconductor device 100 can be used as a power semiconductor device (a power device) or the like configured to convert input power to a predetermined power by using, for example, first to sixth power semiconductor elements 15a to 15f.

The circuit board 10 includes an insulation plate 11, a circuit pattern layer group (12a, 12b, 12c, and 12d) arranged on an upper surface of the insulation plate 11, and a metal plate 13 arranged on a lower surface of the insulation plate 11. Examples of materials employable for the insulation plate 11 include various kinds of insulation materials, such as resins such as epoxy resins and liquid crystal polymers, ceramics such as aluminum oxide ($Al_2O_3$), beryllium oxide (BeO), aluminum nitride (AlN), boron nitride (BN), and silicon nitride ($Si_3N_4$), and composite materials such as fiber-reinforced plastics. Materials of the circuit pattern layer group (12a to 12d) and the metal plate 13 are also not particularly limited, and various kinds of metals having low electrical resistivity, such as aluminum (Al), Al alloys, copper (Cu), and Cu alloys, are employable. Particularly, when the insulation plate 11 is a ceramic base plate, a direct copper bonded (DCB) substrate, an active metal brazed (AMB) substrate, or the like can be employed as the circuit board 10.

The circuit pattern layer group (12a to 12d) includes a first circuit pattern layer 12a, a second circuit pattern layer 12b, a third circuit pattern layer 12c, and a fourth circuit pattern layer 12d. The first circuit pattern layer 12a is mounted with the first to third three semiconductor elements 15a, 15b, and 15c on an upper surface thereof. The second circuit pattern layer 12b is mounted with the fourth semiconductor element 15d on an upper surface thereof. The third circuit pattern layer 12c is mounted with the fifth semiconductor element 15e on an upper surface thereof. The fourth circuit pattern layer 12d is mounted with the sixth semiconductor element 15f on an upper surface thereof. The first to sixth semiconductor elements 15a to 15f are arranged in a row in parallel to a longitudinal direction (Y direction) of the circuit board 10 on the circuit board 10. In FIG. 1 and the like, a right-handed XYZ coordinate system is illustrated for convenience. Additionally, in the present specification, the expression "in plan view" means a case in which an upper surface of the semiconductor device 100 is seen from a positive direction of a Z axis.

As illustrated in FIG. 2, the circuit board 10 is sealed by the seal resin 6, except for a lower surface of the metal plate 13 for cooling. The seal resin 6 has, for example, a rectangular parallelepiped shape. The lower surface of the metal plate 13 is directly or indirectly contacted with a cooler, such as, for example, a heat sink. The circuit board 10 transmits heat, which is generated by the first to sixth semiconductor elements 15a to 15f due to respective flow of main current to the active regions, to the cooler bonded to the lower surface of the metal plate 13. This allows the semiconductor device 100 to discharge the heat generated by the first to sixth semiconductor elements 15a to 15f to an outside thereof via the circuit board 10. It suffices that the circuit pattern layer group (12a to 12d) has an area necessary for bonding to the first to sixth semiconductor elements 15a to 15f and lead terminals included in the connection terminal group (401, 402). Minimizing the size and weight of the circuit board 10 in accordance with design limitations such as insulation distance of the circuit pattern layer group (12a to 12d) enables reduction of manufacturing cost.

The first to sixth semiconductor elements 15a to 15f are semiconductor chips in which switching elements are formed on a semiconductor substrate including, for example, silicon, (Si), silicon carbide (SiC), gallium nitride (GaN), or the like. The first to sixth semiconductor elements 15a to 15f include a bipolar joint transistor (BJT), a field effect transistor (FET), a static induction transistor (SIT), and the like. The first to sixth semiconductor elements 15a to 15f may include an insulated gate bipolar transistor (IGBT), a gate turn-off (GTO) thyristor, a static induction (SI) thyristor, and the like. Furthermore, in addition to these semiconductor switching elements, the first to sixth semiconductor elements 15a to 15f can include diodes such as a Schottky-barrier diode. Besides, the first to sixth semiconductor elements 15a to 15f may include a reverse blocking IGBT (RB-IGBT) and a reverse conducting IGBT (RC-IGBT), which integrate an IGBT and a free-wheeling diode into one chip.

One example of the first to sixth semiconductor elements 15a to 15f can be a semiconductor element having a vertical structure in which, for example, a first main electrode is arranged on an upper surface thereof and a second main electrode is arranged on a lower surface thereof. In a case where the first to sixth semiconductor elements 15a to 15f are IGBTs or BJTs, the first main electrode refers to any one of an emitter electrode or a collector electrode, and the second main electrode refers to an other electrode thereof. In the case of IGBTs, a control electrode refers to a gate electrode, while in the case of BJTs, the control electrode refers to a base electrode. In FETs, SITs, and the like, the first main electrode refers to any one of a source electrode or a drain electrode, the second main electrode refers to an other electrode thereof, and the control electrode refers to a gate electrode. In thyristors such as a GTO thyristor, the first main electrode refers to any one of an anode electrode or a cathode electrode, the second main electrode refers to an other electrode thereof, and the control electrode refers to a gate electrode.

As illustrated in FIG. 1 and FIG. 2, the first semiconductor element 15a is bonded to an upper surface of the first circuit pattern layer 12a via a melt-bonding portion 21a. Similarly, the second semiconductor element 15b and the third semiconductor element 15c, respectively, are bonded to the upper surface of the first circuit pattern layer 12a via melt-bonding portions 21b and 21c, respectively. The fourth semiconductor element 15d is bonded to an upper surface of the second circuit pattern layer 12b via a melt-bonding portion 21d. The fifth semiconductor element 15e is bonded to an upper surface of the third circuit pattern layer 12c via a melt-bonding portion 21e. The sixth semiconductor element 15f is bonded to an upper surface of the fourth circuit pattern layer 12d via a melt-bonding portion 21f. Examples of the melt-bonding portions 21a to 21f employable include tin (Sn)-antimony (Sb) based and Sn—Cu based eutectic solders. Alternatively, a bonding material such as nano-silver paste may be substituted as the melt-bonding portions 21a to 21f.

As illustrated in FIG. 1, the connection terminal group (401, 402) is classified into a power terminal group 401 allowing large current to flow therethrough and a signal terminal group 402 for control signal. The connection terminal group (401, 402) is a lead frame including Cu, Cu alloy, Al, Al alloy, or the like. The Power terminal group 401 includes a bonding lead group (3a, 3b, 3c and 3d), a negative electrode lead group (41a, 41b, and 41c), and a contact lead group (51a and 51d).

The bonding lead group (3a to 3d) includes a first bonding (positive electrode) lead 3a, a second bonding lead 3b, a third bonding lead 3c, and a fourth boding lead 3d. In the semiconductor device according to the first embodiment, the first bonding lead 3a, the second bonding lead 3b, the third bonding lead 3c, and the fourth bonding lead 3d are arranged side by side in parallel to a direction in which the first to sixth semiconductor elements 15a to 15f are arranged. In other words, the first bonding lead 3a, the second bonding lead 3b, the third bonding lead 3c, and the fourth bonding lead 3d are arranged in a row in the longitudinal direction (a long side direction) of the circuit board 10 having a rectangular shape. The negative electrode lead group (41a, 41b, and 41c) includes a first wire lead 41a, a second wire lead 41b, and a third wire lead 41c. The negative electrode lead group (41a, 41b, and 41c), together with the bonding lead group (3a to 3d), is arranged side by side in a row. The contact lead group (51a and 51d) includes a first pressing portion 51a and a second pressing portion 51d.

The signal terminal group 402 includes a plurality of signal leads 42a, 42b, 42c, and others (hereinafter generically referred to as "signal leads 42"). The plurality of signal leads 42 are each selectively connected to a die pad 43. On an upper surface of the die pad 43 is mounted an unillustrated control circuit (IC) by die bonding. The control circuit for drive control and protection of the first to sixth semiconductor elements 15a to 15f is integrated on an IC semiconductor chip mounted on the die pad 43. Additionally, the signal leads 42 can be connected to an other control circuit, control electrodes of the first to sixth semiconductor elements 15a to 15f, and the like via unillustrated control wires. In other words, the signal leads 42, the control circuit, the control electrodes of the first to sixth semiconductor elements 15a to 15f, and the like are appropriately wire-bonded to each other by the plurality of control wires.

FIG. 2 is a cross-sectional view focusing on the first bonding lead 3a. As illustrate in FIG. 1 and FIG. 2, the first bonding lead 3a includes a bonding portion 31a connected to the first circuit pattern layer 12a via a melt-bonding portion 22a. Although unillustrated in the cross-sectional view, similarly, the second boding lead 3b includes a bonding portion 31b connected to the second circuit pattern layer 12b via a melt-bonding portion 22b. The third boding lead 3c includes a bonding portion 31c connected to the third circuit pattern layer 12c via a melt-bonding portion 22c. The fourth boding lead 3d includes a bonding portion 31d connected to the fourth circuit pattern layer 12d via a melt-bonding portion 22d. The melt-bonding portions 22a, 22b, 22c, and 22d are members formed by solidification of a bonding material heated and melted in a reflow process.

Figure 3:
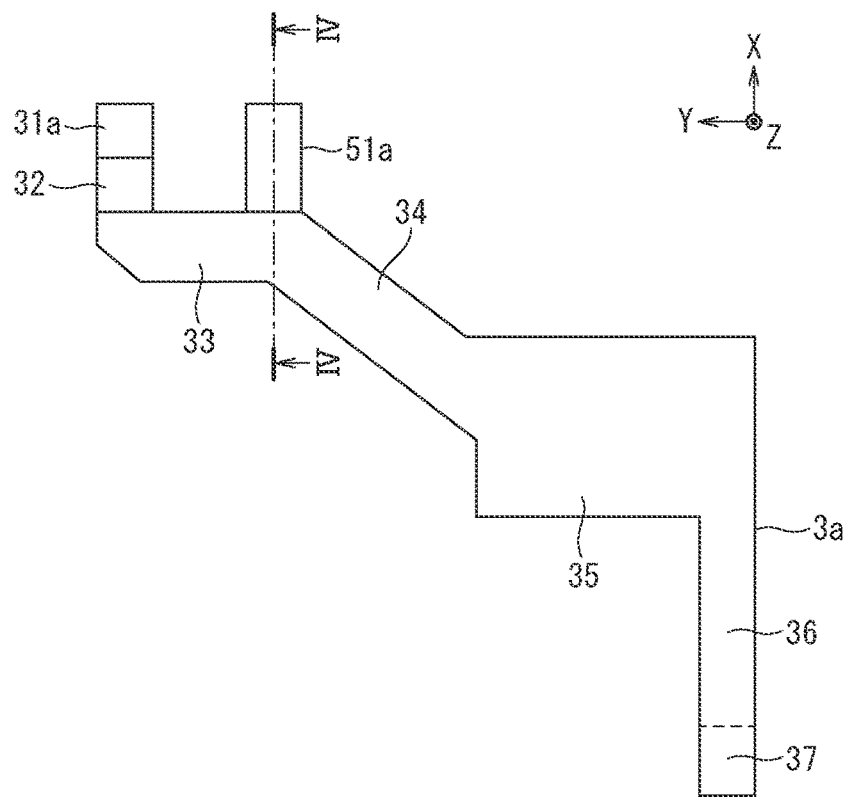
FIG. 3 is a perspective view illustrating a bonding lead and a contact lead of the semiconductor device according to the embodiment of the present invention.

As illustrated in a detailed structure of FIG. 3, the first bonding lead 3a further includes, for example, a descending portion 32, a connecting portion 33, a first extending portion 34, a large width portion 35, and a second extending portion 36. With the structure illustrate in FIG. 3, the bonding portion 31a of the first bonding lead 3a continues to the second extending portion 36, passing through the descending portion 32, the connecting portion 33, the first extending portion 34, and the large width portion 35 in this order. In the first bonding lead 3a, a direction in which the descending portion 32 extends is orthogonal to a longitudinal direction of the connecting portion 33. In plan view, as seen from a positive direction of the Z axis, while the first extending portion 34 is inclined toward an X axis with respect to the longitudinal direction (Y axis direction) of the connecting portion 33, a longitudinal direction of the large width portion 35 is parallel with the longitudinal direction of the connecting portion 33. As illustrated in a part of a cross section of FIG. 4, the first bonding lead 3a, except for the descending portion 32, is arranged parallel to the circuit board 10. A leading end of the second extending portion 36 forms an outer lead 37 exposed from the seal resin 6. A direction in which the second extending portion 36 continues to the outer lead 37 is orthogonal to the longitudinal direction of the connecting portion 33. The first pressing portion 51a illustrated in FIG. 3 is connected to the first bonding lead 3a in an orthogonal direction in the connecting portion 33. In other words, the first pressing portion 51a is branched into an L-shape from the first bonding lead 3a in the connecting portion 33, and then, together with the bonding portion 31a and the descending portion 32, is branched into a fork. The bonding portion 31a and the descending portion 32 may be arranged so as to form, for example, a U-shape.

Figure 4:
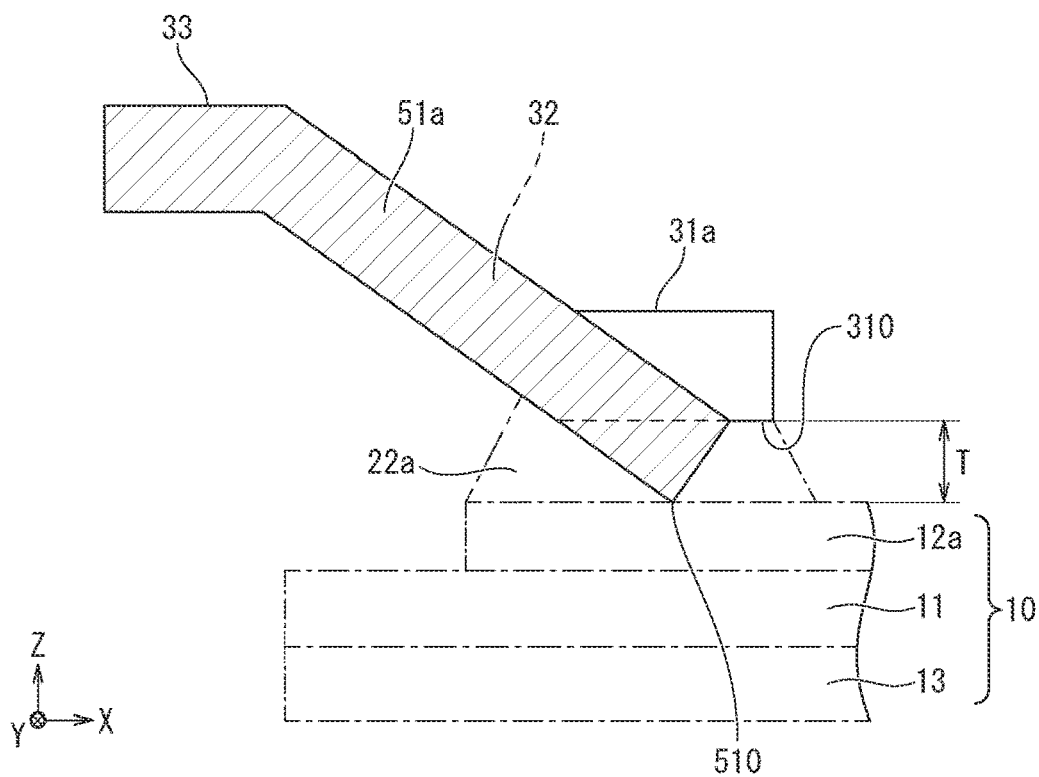
FIG. 4 is a cross-sectional view as seen from direction IV-IV direction of FIG. 3.

As illustrated in FIG. 4, the bonding portion 31a faces in parallel to the upper surface of the first circuit pattern layer 12a, and includes a counterface surface 310 (a lower surface) electrically connected to the upper surface of the first circuit pattern layer 12a via the melt-bonding portion 22a. In the cross-sectional view of FIG. 4, the descending portion 32 hidden on a back side of the first pressing portion 51a inclines in a lower right direction from the connecting portion 33 extending in a horizontal direction, and supports the bonding portion 31a extending in the horizontal direction. In other words, when seen from the direction illustrated in FIG. 4, the connecting portion 33, the descending portion 32, and the bonding portion 31a form a Z-shape, in which the connecting portion 33 and the bonding portion 31a are formed to have a stepped structure. The connecting portion 33 and the bonding portion 31a are located at mutually different horizontal levels, whereby the bonding portion 31a faces in parallel to the upper surface of the first circuit pattern layer 12a. In FIG. 4, the descending portion 32 inclines down to the bonding portion 31a so as to go downward with increasing distance from the connecting portion 33. However, the descending portion 32 may be provided at 90 degrees relative to the bonding portion 31a and the connecting portion 33.

In the plan view pattern of FIG. 3, a continuous body of the bonding portion 31a and the descending portion 32 and the first pressing portion 51a form the U-shape. However, in FIG. 4, the descending portion 32 extends parallel in such a manner as to be hidden by the first pressing portion 51a. In other words, the connecting portion 33 supports the continuous body of the bonding portion 31a and the descending portion 32 and the first pressing portion 51a, for example, so as to allow them to extend in parallel to each other. The first pressing portion 51a includes, at a leading end side thereof, a contact portion 510 that is mechanically directly contacted with a contact region defined on the upper surface of the circuit board 10. In FIG. 4, the contact portion 510 is indicated as a point that is in point contact at an end portion (a top portion) of a lower surface of the first pressing portion 51a, but actually, is provided in a linear shape extending perpendicularly to a paper surface. In other words, in the first embodiment, the contact region of the circuit board 10 is defined as a linear region that is contacted with the contact portion 510 on the upper surface of the first circuit pattern layer 12a.

A thickness T of the melt-bonding portion 22a illustrated in FIG. 4 corresponds to a distance between the upper surface of the first circuit pattern layer 12a and the counterface surface 310. The first bonding lead 3a is designed such that when the contact portion 510 is contacted with the circuit board 10, the distance between the upper surface of the first circuit pattern layer 12a and the counterface surface 310 of the bonding portion 31a coincides with the predetermined thickness T. In other words, in the first embodiment, the first bonding lead 3a is designed such that the distance to the contact portion 510 with reference to a plane coincident with the counterface surface 310 of the bonding portion 31a becomes T. The thickness T is, for example, from 10 to 100 μm. The first bonding lead 3a and the first pressing portion 51a are bent so as to include the first bonding portion 31a, the descending portion 32, the connecting portion 33, and the contact portion 510 by, for example, a press machine or the like.

In the planar pattern as seen from above illustrated in FIG. 1, the bonding portion 31a, the descending portion 32, and the second extending portion 36 illustrated in FIG. 3 extend toward a direction orthogonal to the direction of arrangement of the first to sixth semiconductor elements 15a to 15f. In the planar pattern from above, the first extending portion 34 extends in a direction different from the direction of arrangement of the first to sixth semiconductor elements 15a to 15f. Specifically, the first extending portion 34 illustrated in FIG. 3 extends to be closer to the second bonding lead 3b side adjacently illustrated in the planar pattern of FIG. 1 with increasing distance from the circuit board 10. As illustrated in FIG. 3, the second extending portion 36 extends in a direction away from the circuit board 10, in parallel to a direction in which the bonding portion 31a and the descending portion 32 continuously extend. The large width portion 35 is provided in a pad form so as to have a width larger than the first extending portion 34 and the second extending portion 36. The bonding portion 31a and the descending portion 32, as well as the first pressing portion 51a are sufficiently shorter than a length measured along the direction of extension of the first extending portion 34, the large width portion 35, and the second extending portion 36.

Each of the second bonding lead 3b, the third bonding lead 3c, and the fourth bonding lead 3d has basically the same structure as that of the first bonding lead 3a, except for dimensional differences and the like due to design requirements. Specifically, although unillustrated, for example, the second bonding lead 3b further includes a descending portion, a connecting portion, a first extending portion, a large width portion, and a second extending portion, similarly to the first bonding lead 3a. However, the second bonding lead 3b and the third bonding lead 3c have no structure of a contact lead such as the first pressing portion 51a. Thus, connecting portions of the second bonding lead 3b and the third bonding lead 3c do not require any area necessary for connection thereof to a contact lead.

Additionally, as illustrated in FIG. 1, the fourth bonding lead 3d has a U-shaped branched structure including the second pressing portion 51d, similarly to the first bonding lead 3a, and is connected to the second pressing portion 51d at a connecting portion. Similarly to the first pressing portion 51a illustrated in FIG. 4, the second pressing portion 51d extends downward with increasing distance from the connecting portion of the fourth bonding lead 3d. Structures not described regarding the second bonding lead 3b, the third bonding lead 3c, and the fourth bonding lead 3d are substantially the same as that of the first bonding lead 3a.

As illustrated in FIG. 2, the first bonding lead 3a is electrically connected to the second main electrode on the lower surface side of the first semiconductor element 15a via the first circuit pattern layer 12a and the melt-bonding portions 21a and 22a. Similarly, the first bonding lead 3a is electrically connected to the second main electrode on the lower surface side of each of the second semiconductor element 15b and the third semiconductor element 15c. The large width portion of the second bonding lead 3b is bonded to one end of a first power wire 25a by wire bonding. An other end of the first power wire 25a is electrically bonded to the first main electrode on the upper surface side of the first semiconductor element 15a. Similarly, the large width portion of the third bonding lead 3c is electrically connected to the first main electrode of the second semiconductor element 15b via a second power wire 25b. The large width portion of the fourth bonding lead 3d is electrically connected to the first main electrode on the upper surface side of the third semiconductor element 15c via a third power wire 25c.

The second bonding lead 3b is electrically connected to the second main electrode of the fourth semiconductor element 15d via the second circuit pattern layer 12b and the melt-bonding portions 22b and 21d. The first wire lead 41a includes a large width portion bonded to one end of a fourth power wire 25d by wire bonding. An other end of the fourth power wire 25d is bonded to the upper surface of the fourth semiconductor element 15d. As a result, the first wire lead 41a is electrically connected to the first main electrode of the fourth semiconductor element 15d via the fourth power wire 25d.

Similarly, the third bonding lead 3c is electrically connected to the second main electrode of the fifth semiconductor element 15e via the third circuit pattern layer 12c and the melt-bonding portions 22c and 21e. The second wire lead 41b is electrically connected to the first main electrode of the fifth semiconductor element 15e via a fifth power wire 25e. The fourth bonding lead 3d is electrically connected to the second main electrode of the sixth semiconductor element 15f via the fourth circuit pattern layer 12d and the meld-bonding portions 22d and 21f. The third wire lead 41c is electrically connected to the first main electrode of the sixth semiconductor element 15f via a sixth power wire 25f.

The connections thus formed allows for formation of a three-phase inverter circuit in the semiconductor device 100. In each phase of U, V, and W of the inverter circuit, the semiconductor elements 15a and 15d, the semiconductor elements 15b and 15e, and the semiconductor elements 15c and 15f, respectively, are connected in series, and the in-series connected bodies are connected in parallel. The second main electrodes of the semiconductor elements 15a, 15b, and 15c are connected to a positive electrode of an external power supply via the first bonding lead 3a. The first main electrodes of the semiconductor elements 15a, 15b, and 15c and the second main electrodes of the semiconductor elements 15d, 15e, and 15f, respectively, are connected to U, V, and W terminals of an external load via the second bonding lead 3b, the third bonding lead 3c, and the fourth bonding lead 3d, respectively. The first main electrodes of the semiconductor elements 15d, 15e, and 15f, respectively, are connected to a negative electrode of the external power supply via the first wire lead 41a, the second wire lead 41b, and the third wire lead 41c, respectively. In this example, each of the semiconductor elements 15a to 15f may be an RC-IGBT integrating an IGBT and a free-wheeling diode into one chip. Switching elements such as IGBTs may be driven and protected by the control IC mounted on the die pad 43.

Although unillustrated, similarly to the structure illustrated in FIG. 4, the second pressing portion 51d includes, at a leading end side thereof, a contact portion that is mechanically directly contacted with a contact region defined on the upper surface of the circuit board 10, as in the first pressing portion 51a. Herein, the contact region of the circuit board 10 is defined as a linear region that is contacted with the contact portion of the second pressing portion 51d on the upper surface of the fourth circuit pattern layer 12d.

The bonding portions 31a to 31d are arranged side by side in a row in parallel to the longitudinal direction of the circuit board 10, as illustrated in FIG. 1. The first pressing portion 51a and the second pressing portion 51d, together with the bonding portions 31a to 31d, are arranged side by side in a row, and positioned at both ends of an array formed by the portions 51a and 51d and the bonding portions 31a to 31d. Respective contact portions of the first pressing portion 51a and the second pressing portion 51d and the bonding portions 31a to 31d are preferably arranged to have a mirror image symmetry. As a mirror plane (plane of symmetry) of the mirror image symmetry, it is sufficient to select a plane passing through and orthogonal to a center in the longitudinal direction of the circuit board 10.

The first pressing portion 51a and the second pressing portion 51d, respectively, directly contact with the first circuit pattern layer 12a and the fourth circuit pattern layer 12d, respectively. In this state, each of the melt-bonding portions 22a to 22d under the respective bonding portions 31a to 31d has a predetermined thickness T.

[Method for Manufacturing Semiconductor Device]

Next, one example of a method for manufacturing the semiconductor device according to the first embodiment will be described with reference to FIG. 5 to FIG. 10.

Figure 5:
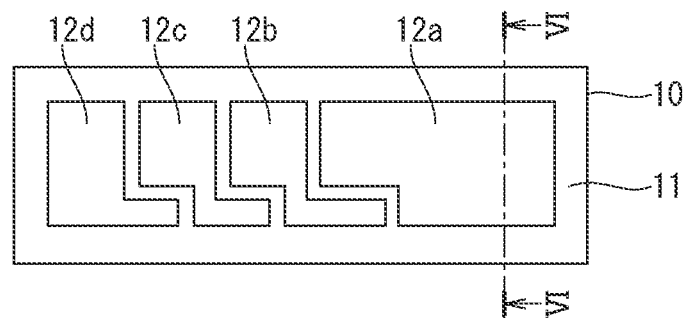
FIG. 5 is a plan view illustrating a method for manufacturing the semiconductor device according to the first embodiment.
Figure 6:
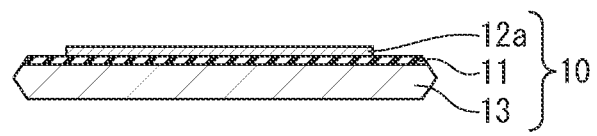
FIG. 6 is a cross-sectional view as seen from direction VI-VI of FIG. 5.

First, as illustrated in FIG. 5 and FIG. 6, on an upper surface of the metal plate 13 including Al or the like and having a rectangular plate-like shape is formed the insulation plate 11 including a thermoplastic resin such as a liquid crystal polymer or a thermosetting resin such as an epoxy resin. Then, on the upper surface of the insulation plate 11 is pattern-formed the circuit pattern layer group (12a to 12d). For example, through the process described above, the circuit board 10 is prepared. Alternatively, the material of the insulation plate 11 may be ceramic. In this case, a DCB substrate or an AMB substrate may be employed as the circuit board 10.

Figure 7:
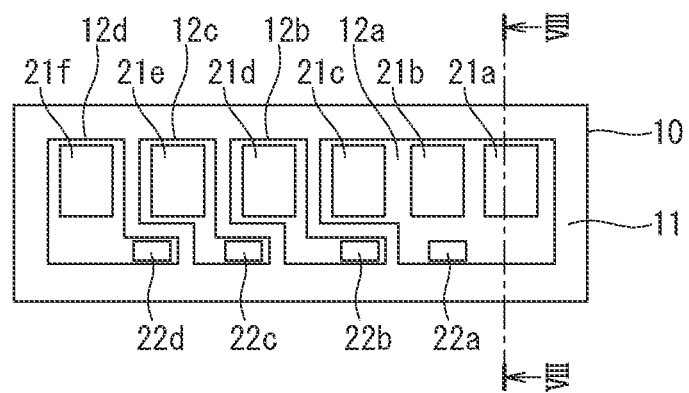
FIG. 7 is a plan view illustrating the method for manufacturing the semiconductor device according to the first embodiment, continuously from FIG. 5 and FIG. 6.
Figure 8:
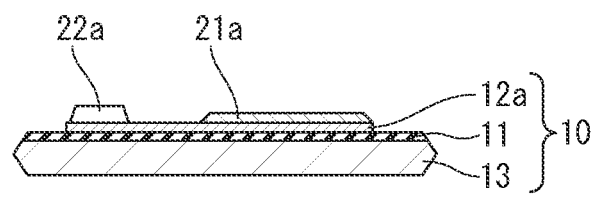
FIG. 8 is a cross-sectional view as seen from direction VIII-VIII of FIG. 7.

Next, as illustrated in FIG. 7 and FIG. 8, the melt-bonding portions 21a to 21f and 22a to 22d in paste form (melt-bonding material paste) are applied on the upper surfaces of the circuit pattern layer group (12a to 12d) by a dispenser or the like. The melt-bonding portions 21a to 21c are selectively applied on respective regions of the upper surface of the first circuit pattern layer 12a, in which region the first to sixth semiconductor elements 15a to 15c (see FIG. 1) are to be mounted. The melt-bonding portion 21d is selectively applied on a region of the upper surface of the second circuit pattern layer 12b, in which region the fourth semiconductor element 15d is to be mounted. The melt-bonding portion 21e is selectively applied on a region of the upper surface of the third circuit pattern layer 12c, in which region the fifth semiconductor element 15e is to be mounted. The melt-bonding portion 21f is selectively applied on a region of the upper surface of the fourth circuit pattern layer 12d, in which region the sixth semiconductor element 15f is to be mounted. The melt-bonding portions 21a to 21f are applied to be arranged side by side in a row in the longitudinal direction of the circuit board 10 on the respective upper surfaces of the circuit pattern layer group (12a to 12d).

The melt-bonding portion 22a is selectively applied on a region of the upper surface of the first circuit pattern layer 12a, in which region the bonding portion 31a (see FIG. 1) of the first bonding lead 3a is to be bonded. The melt-bonding portion 22b is selectively applied on a region of the upper surface of the second circuit pattern layer 12b, in which region the bonding portion 31b of the second bonding lead 3b is to be bonded. The melt-bonding portion 22c is selectively applied on a region of the upper surface of the third circuit pattern layer 12c, in which region the bonding portion 31c of the third bonding lead 3c is to be bonded. The melt-bonding portion 22d is selectively applied on a region of the upper surface of the fourth circuit pattern layer 12d, in which region the bonding portion 31d of the fourth bonding lead 3d is to be bonded. The melt-bonding portions 22a to 22d are applied to be arranged side by side in a row in parallel to the melt-bonding portions 21a to 21f on the respective upper surfaces of the circuit pattern layer group (12a to 12d).

Figure 9:
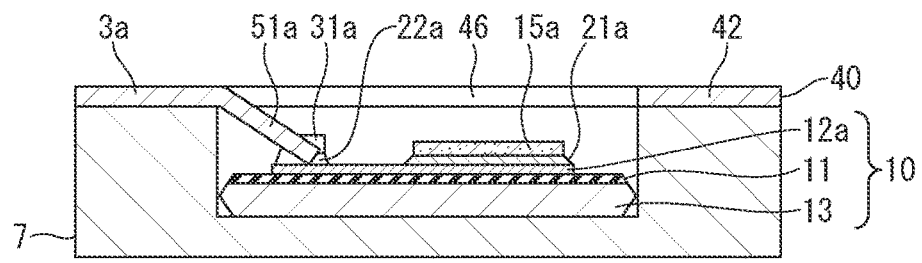
FIG. 9 is a cross-sectional view illustrating the method for manufacturing the semiconductor device according to the first embodiment, continuously from FIG. 7 and FIG. 8.

Next, as illustrated in FIG. 9, the circuit board 10 is horizontally accommodated while keeping the lower surface thereof in contact with an inner bottom portion of a conveying jig 7, and is fixed to the conveying jig 7. Additionally, the first semiconductor element 15a is mounted on the melt-bonding portion 21a. Although unillustrated in FIG. 9, the other second to sixth semiconductor elements 15b to 15f are also similarly mounted on the melt-bonding portions 21b to 21f, respectively. Then, a lead frame 40 is mounted on the conveying jig 7 such that the bonding portion 31a of the first bonding lead 3a is arranged on the melt-bonding portion 22a. Although unillustrated in FIG. 9, similarly, in this case, the other bonding portions 31b to 31d, respectively, are arranged on the melt-bonding portions 22b to 22d. The lead frame 40 is mounted in parallel to the circuit board 10.

Figure 10:
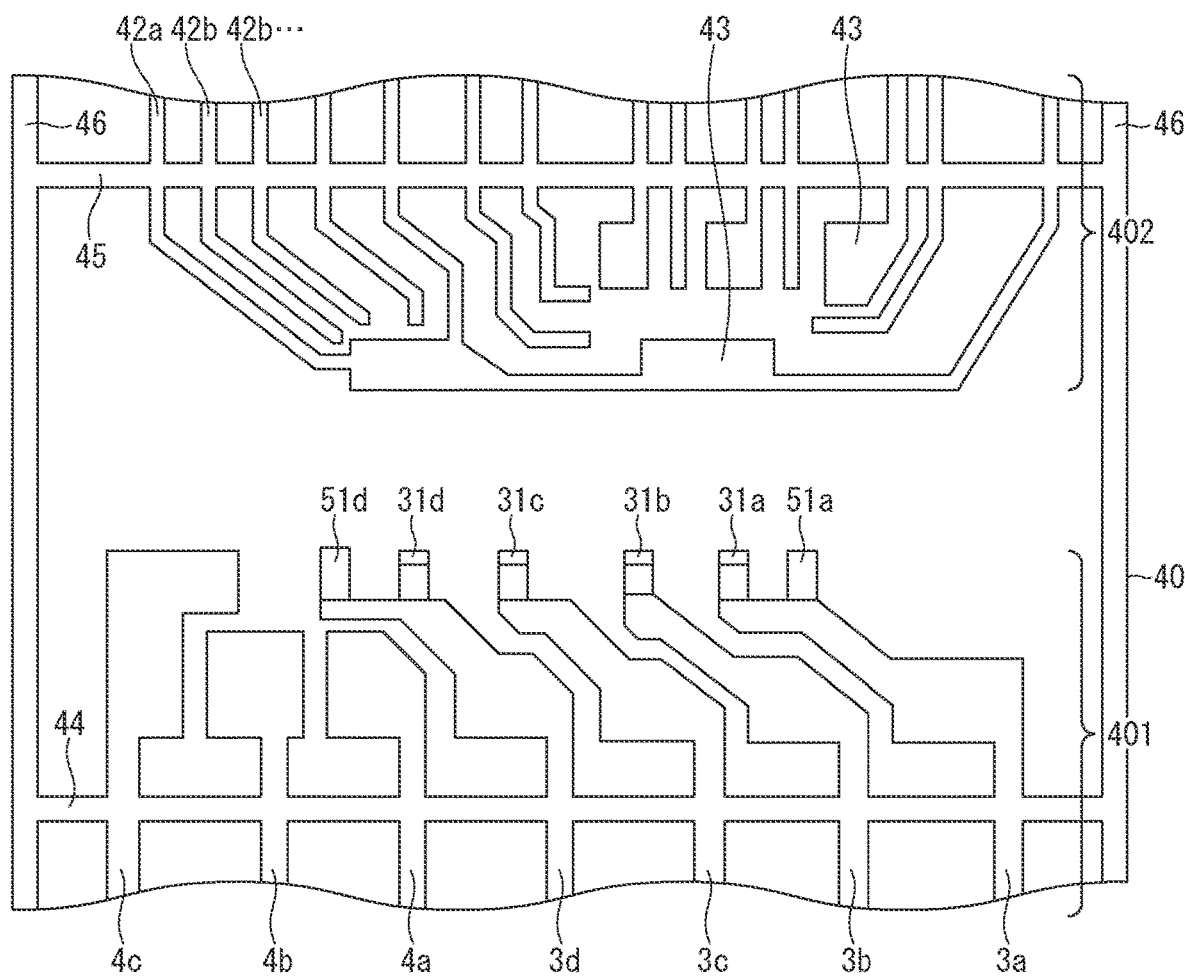
FIG. 10 is a plan view illustrating a lead frame for use in the method for manufacturing the semiconductor device according to the first embodiment.

As illustrated in FIG. 10, the lead frame 40 includes the power terminal group 401 and the signal terminal group 402. The lead frame 40 further includes a first tie bar 44 supporting the power terminal group 401, a second tie bar 45 supporting the signal terminal group 402, and a frame portion 46 supporting the first tie bar 44 and the second tie bar 45. The lead frame 40 is formed using a tape-like metal plate on which patterns of leads and the like are formed by punching out or etching, and then leading ends of the leads are selectively bent. The leading ends of the leads formed by bending form the bonding portions 31a to 31d as well as the first pressing portion 51a and the second pressing portion 51d.

As illustrated in FIG. 9, with the circuit board 10 mounted with the first to sixth semiconductor elements 15a to 15f and the lead frame 40 fixed to the conveying jig 7, the conveying jig 7 is conveyed to an unillustrated reflow furnace. The melt-bonding portions 21a to 21f and 22a to 22d applied on the circuit board 10 are melted by heating in the reflow furnace.

When the melt-bonding portions 21a to 21f and 22a to 22d are melted in the state illustrated in FIG. 9, the first pressing portion 51a and the second pressing portion 51d of the lead frame 40 contact with the contact region defined on the upper surface of the circuit board 10. The first pressing portion 51a and the second pressing portion 51d contact with and press against the contact region of the circuit board 10, thereby allowing the entire lower surface of the circuit board 10 to be firmly attached to the bottom portion of the conveying jig 7. At the same time, the respective bonding portions 31a to 31d of the bonding lead group (3a to 3d) face the upper surfaces of the circuit pattern layer group (12a to 12d) in parallel to each other with a gap therebetween. These gaps are equal to the thickness T of the melt-bonding portions 22a to 22d (see FIG. 4).

When not pressed by the first pressing portion 51a and the second pressing portion 51d, the circuit board 10 can be pulled up to the lead frame 40 side by surface tension of the molten melt-bonding portions 22a to 22d. By contrast, in the semiconductor device according to the first embodiment, the first pressing portion 51a and the second pressing portion 51d press the circuit board 10 against the bottom portion of the conveying jig 7 during the reflow process to allow the firm attachment to be maintained. Thus, even when the melt-bonding portions 22a to 22d are melted during the reflow process, the circuit board 10 is pressed by the first pressing portion 51a and the second pressing portion 51d, and therefore does not float up.

After that, the first to sixth semiconductor elements 15a to 15f and the power terminal group 401 are electrically connected to each other using the first to sixth power wires 25a to 25f (see FIG. 1). Additionally, the control circuit is bonded to the die pad 43, and the signal leads 42 are electrically connected to the control circuit and the control electrodes of the first to sixth semiconductor elements 15a to 15f by using the control wires. Note that the control wires have a diameter smaller than that of the first to sixth power wires 25a to 25f, because current flowing through the control wires is smaller than current flowing through the first to sixth power wires 25a to 25f. For example, the diameter of the first power wire 25a is approximately 10 times that of control wire.

The melt-bonding portions 21a to 21f and 22a to 22d, and the like are solidified and mutually bonded on the circuit board 10. Then, a structural body including the circuit board 10 and the lead frame 40 is accommodated in an unillustrated transfer molding die. The die is configured such that the seal resin 6 is formed into, for example, a rectangular parallelepiped, and the lower surface of the circuit board 10 and respective outer leads of the connection terminal group (401, 402) are exposed from the seal resin 6, as illustrated in FIG. 1 and FIG. 2. Furthermore, the die is configured such that a gate for injecting a material into a cavity is positioned on the power terminal group 401 side (the left side in FIG. 2). This configuration can prevent the thin control wires from being excessively displaced due to inflow of the resin material.

Next, a heated thermosetting resin such as an epoxy resin is transferred into the cavity of the die under reduced pressure. The circuit board 10 is accommodated in the cavity in a state where the upper surface of the circuit board 10 is contacted with the first pressing portion 51a and the second pressing portion 51d, and the lower surface thereof is contacted with a bottom surface in the cavity. Thus, the resin material does not infiltrate under the circuit board 10, and formation of burr (flash) under the lower surface of the seal resin 6 can be suppressed. The resin material is cooled, and the first tie bar 44, the second tie bar 45, and the frame portion 46 unnecessary in the lead frame 40 are removed, whereby there can be obtained the semiconductor device 100 according to the first embodiment illustrated in FIG. 1 and FIG. 2.

In the semiconductor device 100 according to the first embodiment, the inclusion of the first pressing portion 51a and the second pressing portion 51d can suppress the circuit board 10 from floating up in a reflow process. This enables obtaining of the thickness T of the melt-bonding portions 22a to 22d between the bonding lead group (3a to 3d) and the circuit pattern layer group (12a to 12d). Thus, the semiconductor device 100 according to the first embodiment can improve resistance against thermal stress.

Additionally, in the semiconductor device 100 according to the first embodiment, the inclusion of the first pressing portion 51a and the second pressing portion 51d can suppress the circuit board 10 from being inclined during a reflow process. This can suppress the resin material from infiltrating under the circuit board 10 during transfer molding, thereby suppressing burrs (flashes) from being formed on the seal resin 6. Thus, the semiconductor device 100 according to the first embodiment and the manufacturing method therefor can improve yield and non-defective rate, enhance reliability, and extend life expectancy of product.

In addition, in the semiconductor device 100 according to the first embodiment, the first pressing portion 51a branched from the first bonding lead 3a is contacted with the first circuit pattern layer 12a to be bonded to the first bonding lead 3a. The first pressing portion 51a is connected to the bonding target of the first bonding lead 3a at the same potential, so that there is no problem in circuit design.

Note that it is conceivable that when the circuit board 10 is about to be pulled up, vicinities of four corners of the circuit board 10 may be pressed by, for example, a pin-shaped jig, instead of the first pressing portion 51a and the second pressing portion 51d. In this case, however, manufacturing cost will increase, as well as extra stress will remain in the circuit board 10. By contrast, in the semiconductor device 100 according to the first embodiment, floating up of the circuit board 10 can be easily suppressed by the lead frame 40 that can be manufactured at the same cost as that of conventional lead frames. Thus, in the semiconductor device 100 according to the first embodiment, manufacturing cost can be reduced, as well as stress to the circuit board 10 is reduced since no excessive pressing is applied to the circuit board 10.

Second Embodiment

Figure 11:
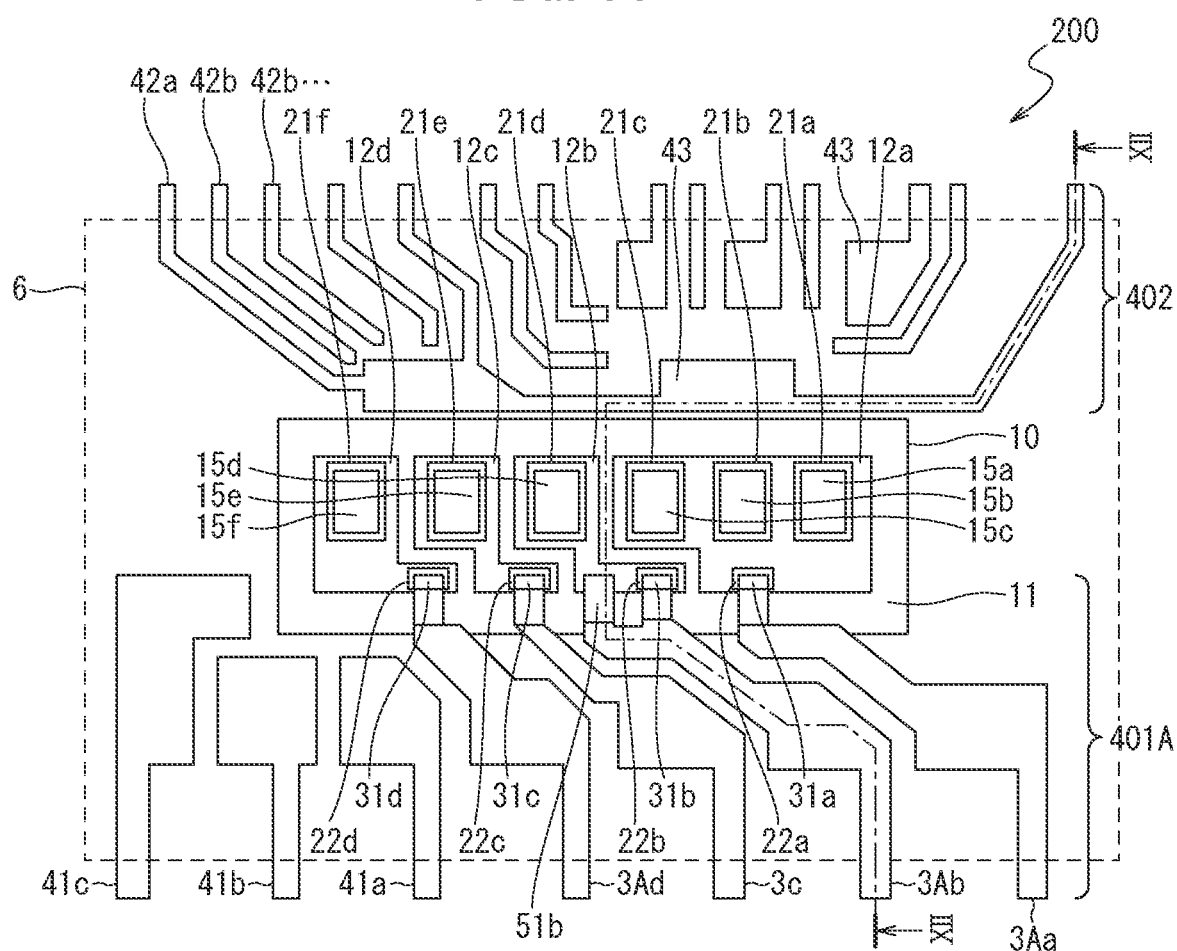
FIG. 11 is a plan view illustrating a basic structure of a semiconductor device according to a second embodiment of the present invention.
Figure 12:
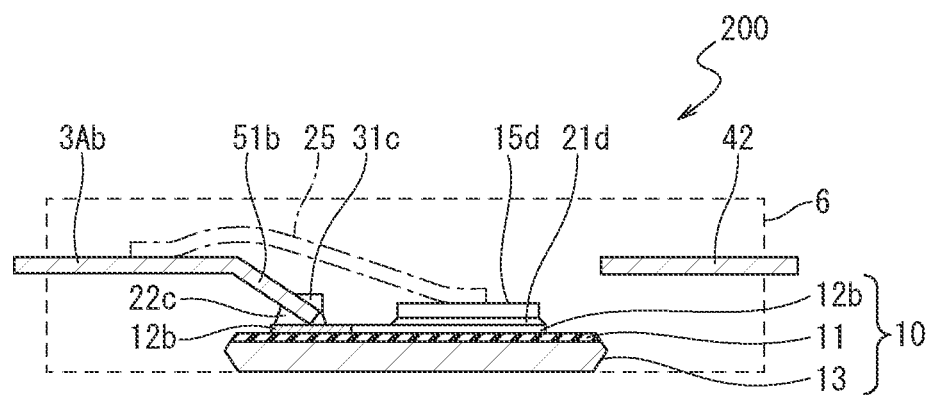
FIG. 12 is a cross-sectional view as seen from direction XII-XII of FIG. 11.

As illustrated in FIG. 11 and FIG. 12, a semiconductor device 200 according to a second embodiment of the present invention is different from the first embodiment in that the semiconductor device 200 includes one pressing portion 51b instead of the contact lead group (51a and 51d). Other structures, functions, and effects not described in the second embodiment are the same as those of the first embodiment. Note that plan views hereinbelow do not illustrate the plurality of power wires 25 (see FIG. 12 and the like) used for appropriate connection between a power terminal group 401A and the first to sixth semiconductor elements 15a to 15f.

As illustrated in FIG. 11, the power terminal group 401A of the second embodiment includes a first bonding lead 3Aa and a fourth bonding lead 3Ad each of which is not connected to a contact lead. Additionally, the pressing portion 51b is connected to a connecting portion of a second bonding lead 3Ab. A contact portion of the pressing portion 51b and the bonding portions 31a to 31d are arranged together side by side in a row in parallel to the longitudinal direction of the circuit board 10. In a planar pattern as seen from above, the contact portion of the pressing portion 51b is positioned at a center among the bonding portions 31a to 31d in the direction of the arrangement, which is also the center in the longitudinal direction of the circuit board 10. The contact portion of the pressing portion 51b and the bonding portions 31a to 31d are arranged so as to have a mirror image symmetry with respect to a mirror plane (plane of symmetry) passing through and orthogonal to the center in the longitudinal direction of the circuit board 10. As illustrated in FIG. 11 and FIG. 12, the pressing portion 51b is contacted with the upper surface of the second circuit pattern layer 12b to which the second bonding lead 3Ab is electrically connected via the melt-bonding portion 22b.

With the above structure, the pressing portion 51b can suppress a force in a direction in which the circuit board 10 floats up due to surface tension of the molten melt-bonding portions 22a to 22d. This enables obtaining of the thickness T of the melt-bonding portions 22a to 22d between the bonding lead group (3Aa to 3Ad) and the circuit pattern layer group (12a to 12d). Additionally, the structure can easily suppress the circuit board 10 from being inclined due to the surface tension of the melt-bonding portions 22a to 22d during a reflow process.

Third Embodiment

Figure 13:
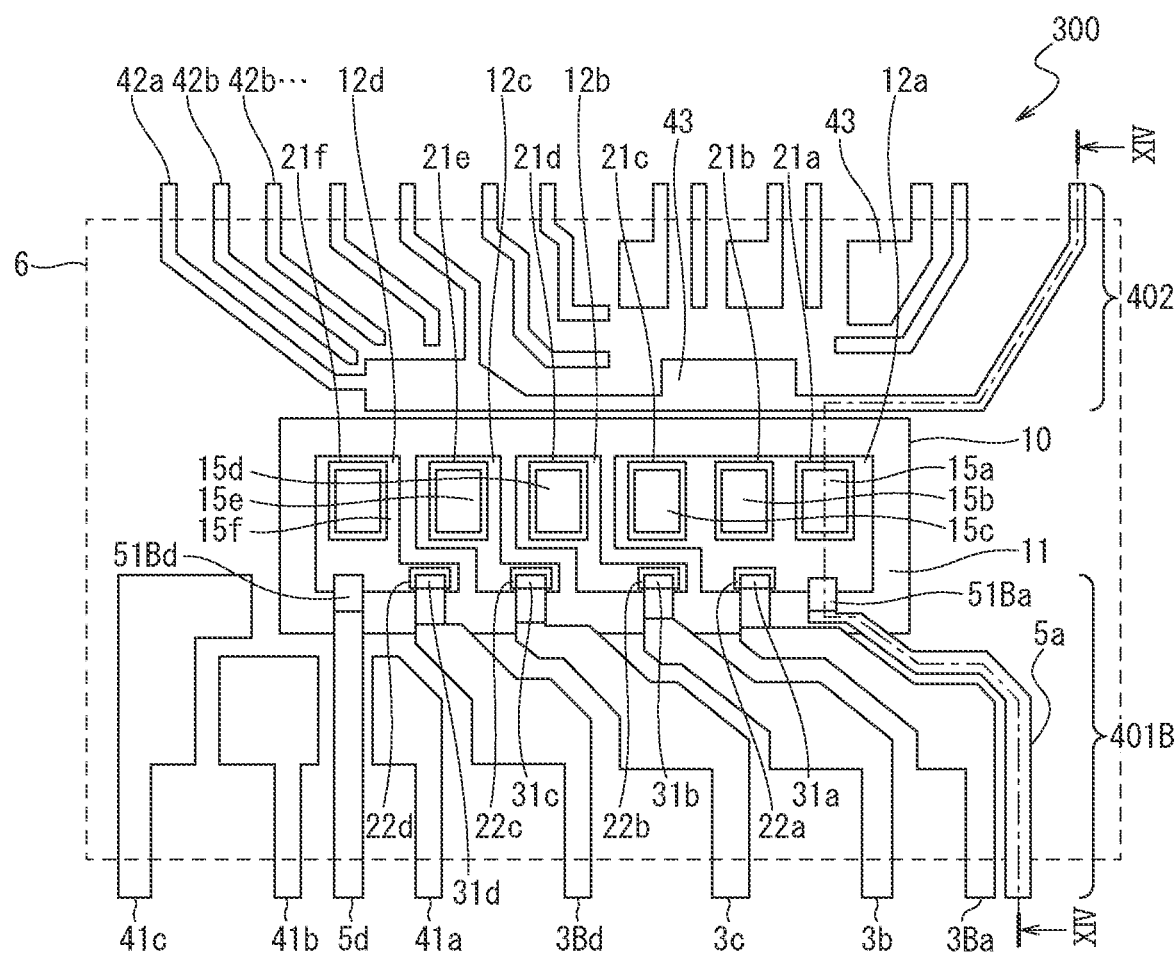
FIG. 13 is a plan view illustrating a basic structure of a semiconductor device according to a third embodiment of the present invention.
Figure 14:
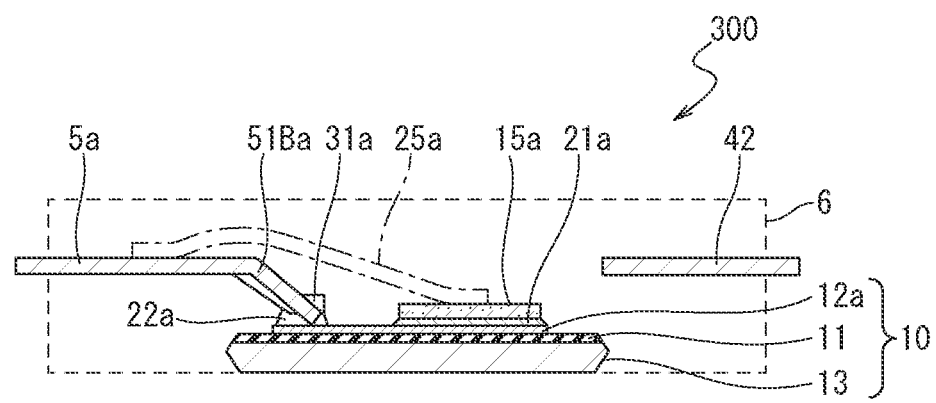
FIG. 14 is a cross-sectional view as seen from direction XIV-XIV of FIG. 13.

As illustrated in FIG. 13 and FIG. 14, a semiconductor device 300 according to a third embodiment of the present invention is different from the first embodiment in that the semiconductor device 300 includes a first pressing portion 51Ba and a second pressing portion 51Bd separated from a bonding lead group (3Ba, 3b, 3c, and 3Bd). Other structures, functions, and effects not described in the third embodiment are the same as those of the first embodiment.

As illustrated in FIG. 13, a power terminal group 401B of the third embodiment includes a first contact lead 5a and a second contact lead 5d each independent from others. In a cross-sectional view of FIG. 14, the first contact lead 5a extending in the horizontal direction includes the first pressing portion 51Ba inclined in a lower right direction at a leading end thereof. Similarly, the second contact lead 5d extending in the horizontal direction includes, at a leading end thereof, the second pressing portion 51Bd extending downward toward a leading end of the portion. The first pressing portion 51Ba and the second pressing portion 51Bd, together with the bonding portions 31a to 31d, are arranged side by side in a row in parallel to the longitudinal direction of the circuit board 10. In a planar pattern as seen from above, the first pressing portion 51Ba and the second pressing portion 51Bd are positioned at both ends of an array formed by the first and second pressing portions 51Ba and 51Bd and the bonding portions 31a to 31d. Respective contact portions of the first contact lead 5a and the second contact lead 5d are preferably arranged to have a mirror image symmetry together with the bonding portions 31a to 31d. As a mirror plane (plane of symmetry) of the mirror image symmetry, it is possible to select a plane passing through and orthogonal to the center in the longitudinal direction of the circuit board 10.

In the semiconductor device 300 according to the third embodiment, the first contact lead 5a and the second contact lead 5d are physically separated from other leads. Thus, as long as portions having mutually different potentials on the circuit board 10 are not short-circuited, the first contact lead 5a and the second contact lead 5d may be contacted with upper surfaces of other circuit pattern layers 12b and 12c. Alternatively, the first contact lead 5a and the second contact lead 5d may be contacted with the upper surface of the insulation plate 11.

In the semiconductor device 300 according to the third embodiment, the inclusion of the first pressing portion 51Ba and the second pressing portion 51Bd can suppress the circuit board 10 from floating up and being inclined during a reflow process. This enables obtaining of the thickness T of the melt-bonding portions 22a to 22d, so that resistance against thermal stress can be improved. Additionally, infiltration of a resin material under the circuit board 10 during transfer molding can be suppressed, whereby formation of burrs (flashes) on the seal resin 6 is suppressed. Thus, the semiconductor device 300 according to the third embodiment and the manufacturing method therefor can improve yield and non-defective rate, enhance reliability, and extend life expectancy of product.

Fourth Embodiment

Figure 15:
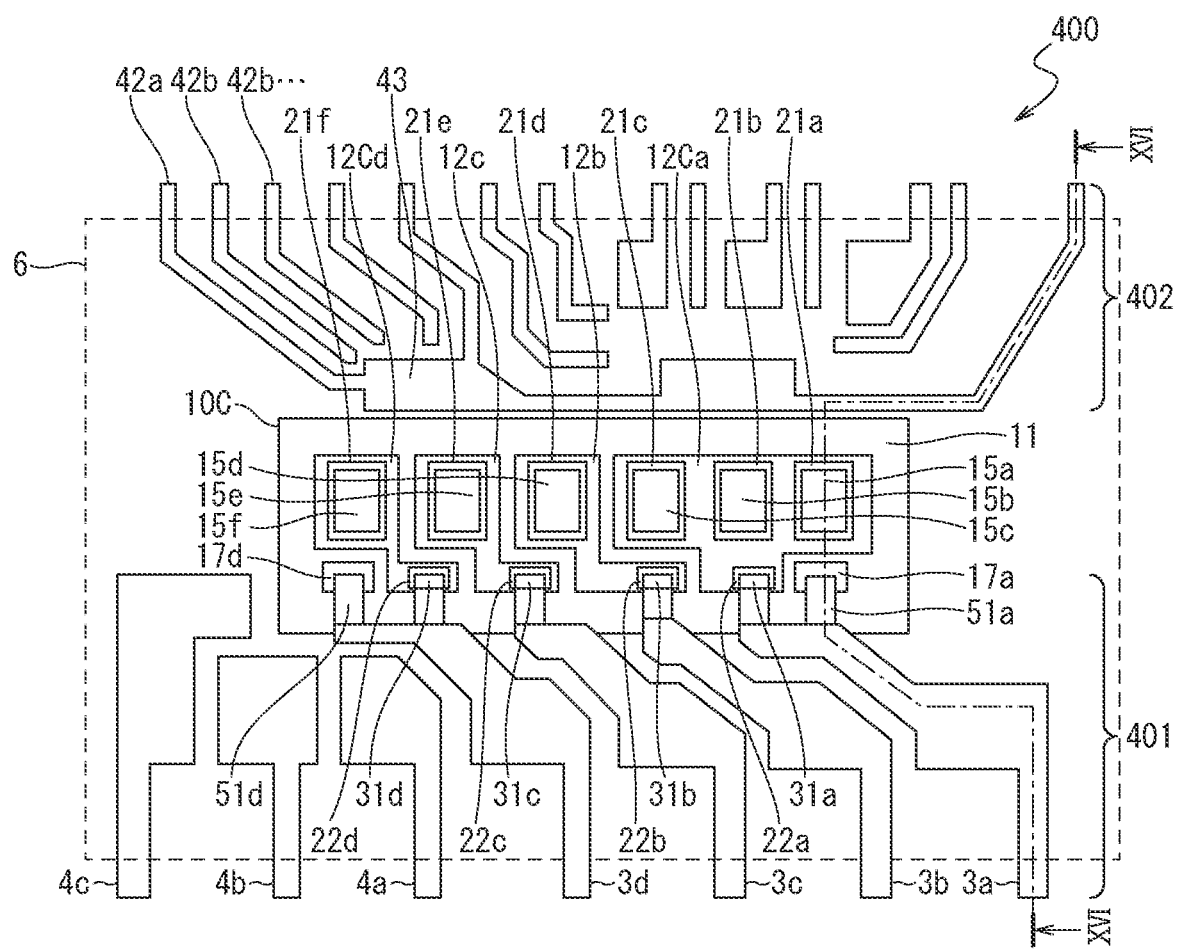
FIG. 15 is a plan view illustrating a basic structure of a semiconductor device according to a fourth embodiment of the present invention.
Figure 16:
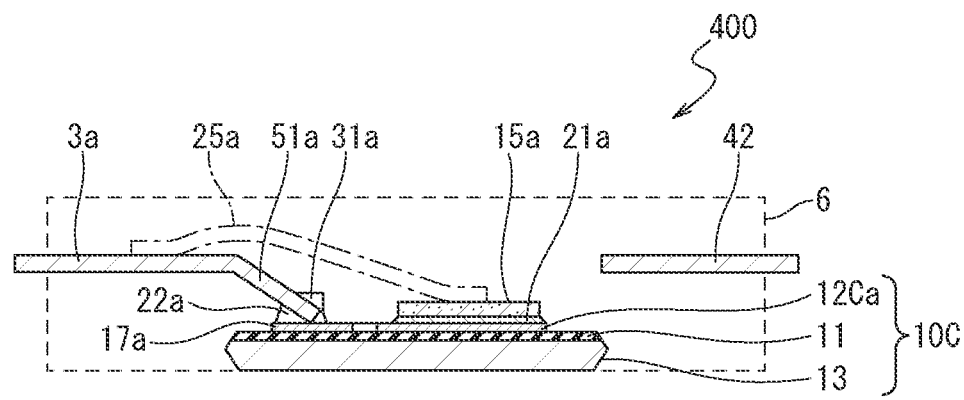
FIG. 16 is a cross-sectional view as seen from direction XVI-XVI of FIG. 15.

As illustrated in FIG. 15 and FIG. 16, a semiconductor device 400 according to a fourth embodiment of the present invention is different from the first embodiment in that the semiconductor device 400 includes a first contact pattern layer 17a and a second contact pattern layer 17d. Herein, the "first contact pattern layer 17a" refers to a contact region in contact with the first pressing portion 51a, and the "second contact pattern layer 17d" refers to a contact region in contact with the second pressing portion 51d. Other structures, functions, and effects not described in the fourth embodiment are the same as those of the first embodiment.

For example, employable as the first contact pattern layer 17a and the second contact pattern layer 17d can be metal pattern layers formed to have the same thickness from the same material as those of the circuit pattern layer group (12a to 12d). The contact portion of the first pressing portion 51a is directly contacted with a contact region defined on an upper surface of the first contact pattern layer 17a. For example, in a planar pattern as seen from above, the first contact pattern layer 17a is formed into a rectangular shape larger than the contact portion of the first pressing portion 51a. The first contact pattern layer 17a is separated from the first circuit pattern layer 12a, and formed on the upper surface of the insulation plate 11. As a result, the first circuit pattern layer 12a has a pattern, a part of which is cut out to avoid the first contact pattern layer 17a.

Similarly, the contact portion of the second pressing portion 51d is directly contacted with a contact region defined on an upper surface of the second contact pattern layer 17d. For example, in a planar pattern as seen from above, the second contact pattern layer 17d is formed into a rectangular shape larger than the contact portion of the second pressing portion 51d. The second contact pattern layer 17d is separated from the fourth circuit pattern layer 12d, and formed on the upper surface of the insulation plate 11. As a result, the fourth circuit pattern layer 12d has a pattern, apart of which is cut out so as to avoid the second contact pattern layer 17d.

In the semiconductor device 400 according to the fourth embodiment, the inclusion of the first pressing portion 51a and the second pressing portion 51d can suppress the circuit board 10 from floating up and being inclined during a reflow process. This enables obtaining of the thickness T of the melt-bonding portions 22a to 22d, so that resistance against thermal stress can be improved. Additionally, infiltration of a resin material under the circuit board 10 during transfer molding can be suppressed, whereby formation of burrs (flashes) on the seal resin 6 is suppressed. Thus, the semiconductor device 400 according to the fourth embodiment and the manufacturing method therefor can improve yield and non-defective rate, enhance reliability, and extend life expectancy of product.

Fifth Embodiment

Figure 17:
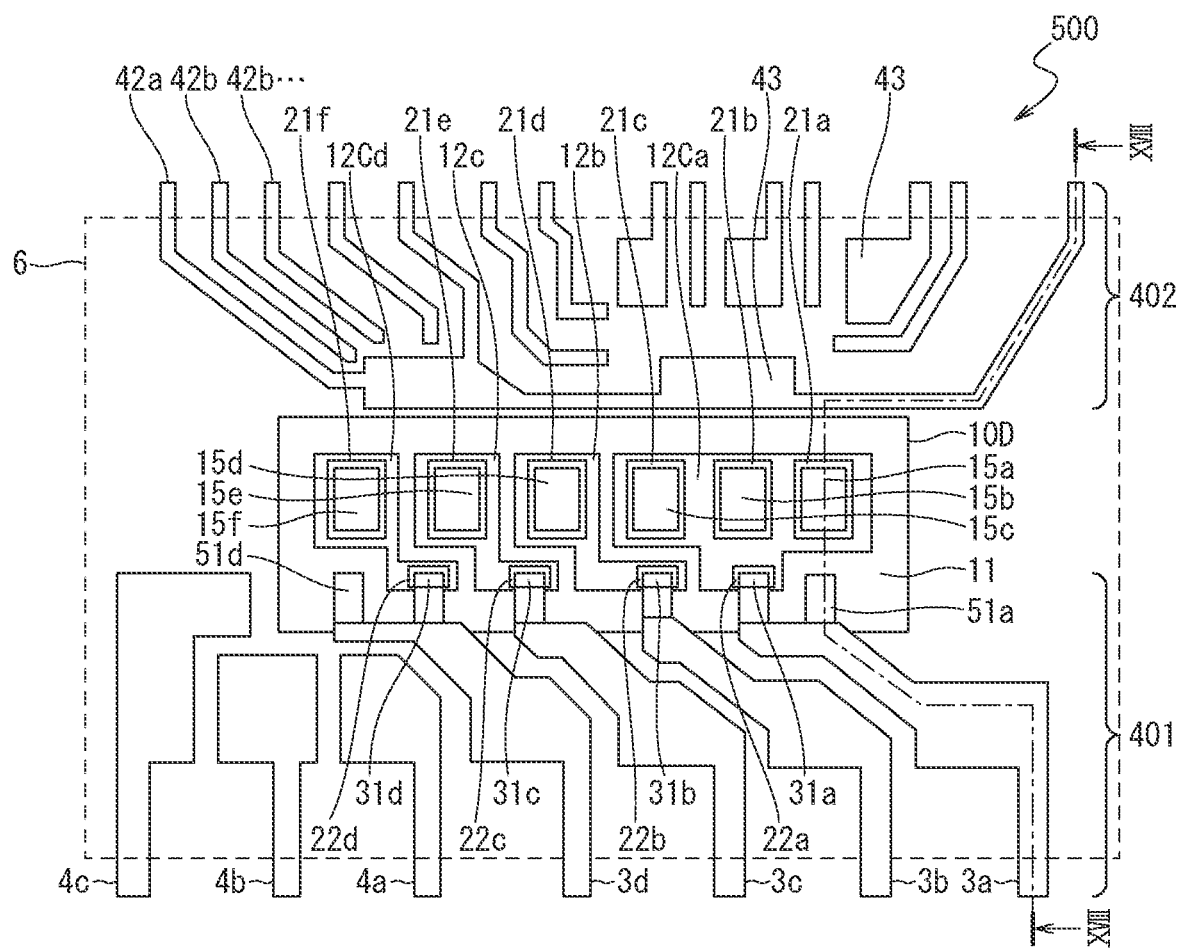
FIG. 17 is a plan view illustrating a basic structure of a semiconductor device according to a fifth embodiment of the present invention.
Figure 18:
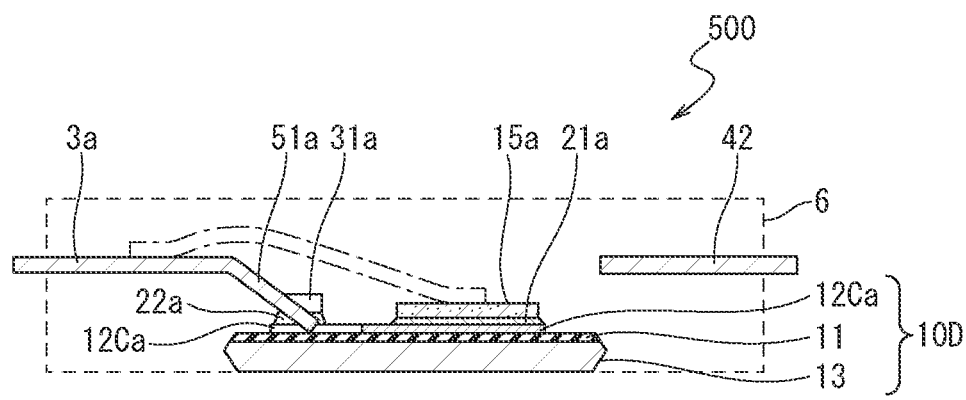
FIG. 18 is a cross-sectional view as seen from direction XVIII-XVIII of FIG. 17.

As illustrated in FIG. 17 and FIG. 18, a semiconductor device 500 according to a fifth embodiment of the present invention is different from the fourth embodiment in that the contact regions with which the first pressing portion 51a and the second pressing portion 51d contact are defined on the upper surface of the insulation plate 11. Other structures, functions, and effects not described in the fifth embodiment are the same as those of the fourth embodiment.

Figure 19:
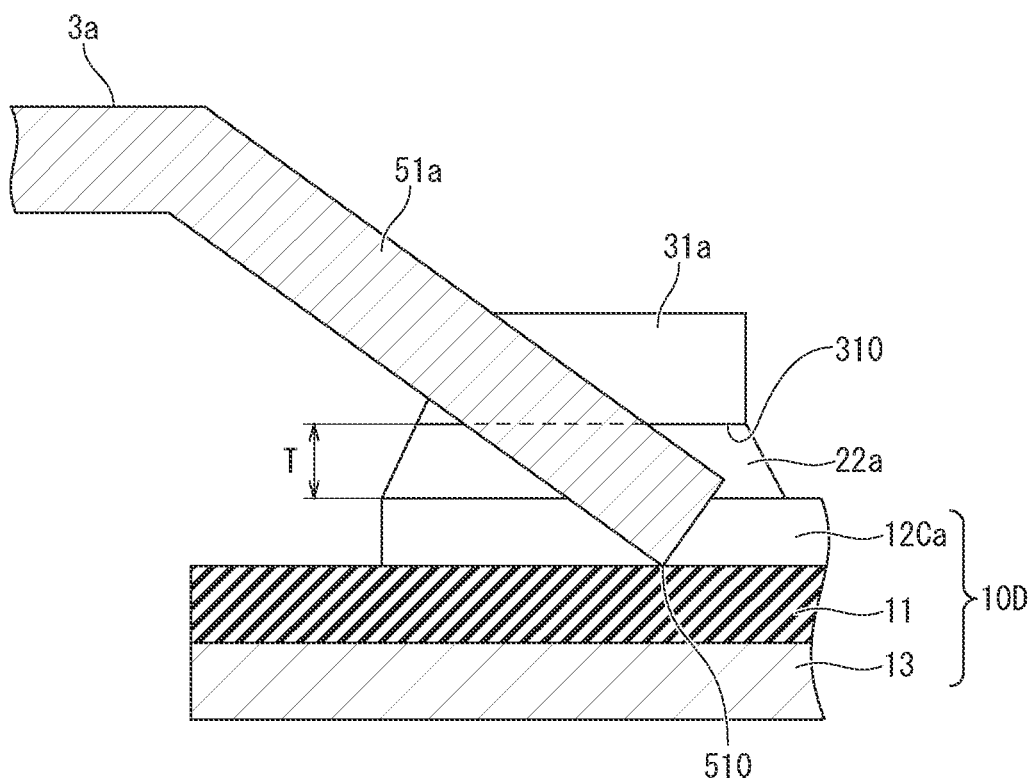
FIG. 19 is a cross-sectional view illustrating by enlarging the vicinity of a bonding portion and a contact portion of FIG. 18.

As illustrated in FIG. 19, the contact portion 510 of the first pressing portion 51a is directly contacted with the contact region defined on the upper surface of the insulation plate 11. In the fifth embodiment, the first bonding lead 3a and the first pressing portion 51a are designed such that a distance between an upper surface of a first circuit pattern layer 12Ca and the counterface surface 310 becomes the thickness T while the contact portion 510 is in contact with the upper surface of the insulation plate 11. In other words, in the fifth embodiment, the distance to the contact portion 510 with reference to a plane coincident with the counterface surface 310 is the sum of the thickness T and a thickness of the first circuit pattern layer 12Ca. The same also applies to the relationship between the fourth bonding lead 3d and the second pressing portion 51d. In the first bonding lead 3a, the first pressing portion 51a is preferably provided so as not to allow the contact portion 510 to damage the insulation plate 11 and affect insulation performance of the insulation plate 11. Furthermore, in the first bonding lead 3a, the first pressing portion 51a may be provided such that an angle formed by the upper surface of the insulation plate 11 and the lower surface of the first pressing portion 51a is an acute angle, and corners of the contact portion 510 may be chamfered into square faces or round faces.

In the semiconductor device 500 according to the fifth embodiment, the inclusion of the first pressing portion 51a and the second pressing portion 51d can suppress the circuit board 10 from floating up and being inclined during a reflow process. This enables obtaining of the thickness T of the melt-bonding portions 22a to 22d, so that resistance against thermal stress can be improved. Additionally, infiltration of a resin material under the circuit board 10 during transfer molding can be suppressed, whereby formation of burrs (flashes) on the seal resin 6 is suppressed. Thus, the semiconductor device 500 according to the fifth embodiment and the manufacturing method therefor can improve yield and non-defective rate, enhance reliability, and extend life expectancy of product.

Other Embodiments

While some embodiments of the present invention have been described above, the description and drawings forming a part of this disclosure should not be understood as limiting the invention. In accordance with the disclosure, various alternative embodiments, working examples, and utilizing technologies will be apparent to those skilled in the art.

For example, in the first to fifth embodiments, each contact portion such as the first pressing portion 51a may be formed into a plane shape. In other words, for example, like the bonding portion 31a of the first bonding lead 3, the contact leads may have a horizontally maintained portion at the leading ends thereof. As a result, the contact leads can be in surface contact with the contact regions on the circuit board 10, thereby allowing the contact leads to press the circuit board 10 in a stable manner.

Additionally, in the fifth embodiment, employing ceramic as the material of the insulation plate 11 can suppress the contact leads from scratching the upper surface of the insulation plate 11. Alternatively, a protective film may be provided on the contact regions by using a hard material such as polyimide, or the upper surface of the insulation plate 11 may be subjected to a surface treatment increasing hardness.

In addition, it is obvious that the present invention includes various embodiments and the like not described herein, such as structures optionally applying the respective structures described in the above embodiments and respective modifications. Accordingly, the technological scope of the invention is defined solely by the matters specifying the invention according to the claims, which are appropriate from the foregoing description.

REFERENCE SIGNS LIST 3a to 3d, 3Ba, 3Bd: Bonding lead
51a, 51b, 51d, 51Ba, 51Bd: Pressing portion
5a, 5d: Contact lead
6: Seal resin
7: Conveying jig
10: Circuit board
11: Insulation plate
12a to 12d, 12Ca, 12Cd: Circuit pattern layer
13: Metal plate
15a to 15f: Semiconductor element
21a to 21f, 22a to 22d: Melt-bonding portion
25, 25a to 25f: Power wire
31a to 31d: Bonding portion
32: Descending portion
33: Connecting portion
34: First extending portion
35: Large width portion
36: Second extending portion
37: Outer lead
40: Lead frame
42: Signal lead
43: Die pad
44: First tie bar
45: Second tie bar
46: Frame portion
100, 200, 300, 400, 500: Semiconductor device
401, 401A, 401B: Connection terminal group (Power terminal group)
402: Signal terminal group
310: Counterface surface
510: Contact portion

The invention claimed is:

1. A semiconductor device comprising:
a circuit board including a circuit pattern layer;
a semiconductor element mounted on the circuit pattern layer;
a melt-bonding material arranged on a part of an upper surface of the circuit pattern layer; and
a connection terminal group formed by including a plurality of leads including a bonding portion electrically connected to the circuit pattern layer via the melt-bonding material and a pressing portion mechanically and directly contacted with an upper surface of the circuit board at a location spaced apart from the semiconductor element in a width direction of the circuit board, the upper surface of the circuit board being located below a bottom surface of the semiconductor element.

2. The semiconductor device according to claim 1, wherein,
the connection terminal group includes a bonding lead electrically connected to the circuit pattern layer via the melt-bonding material and a contact lead mechanically contacted with the upper surface of the circuit board,
the bonding portion is provided at a leading end of the bonding lead, and
the pressing portion is provided at a leading end of the contact lead.

3. The semiconductor device according to claim 1, wherein,
the connection terminal group includes a bonding lead electrically connected to the circuit pattern layer via the melt-bonding material, and
each of the pressing portion and the bonding portion is branched from a part of a leading end side of the bonding lead.

4. The semiconductor device according to claim 1, wherein,
the circuit board further includes an insulation plate, and
the circuit pattern layer is arranged on an upper surface of the insulation plate.

5. The semiconductor device according to claim 4, wherein the pressing portion is directly contacted with the upper surface of the insulation plate.

6. The semiconductor device according to claim 2, wherein,
the circuit board further includes an insulation plate, and
the circuit pattern layer is arranged on an upper surface of the insulation plate.

7. The semiconductor device according to claim 6, wherein the pressing portion is directly contacted with the upper surface of the insulation plate.

8. The semiconductor device according to claim 3, wherein,
the circuit board further includes an insulation plate, and
the circuit pattern layer is arranged on an upper surface of the insulation plate.

9. The semiconductor device according to claim 8, wherein the pressing portion is directly contacted with the upper surface of the insulation plate.

10. A method for manufacturing the semiconductor device according to claim 1, the method comprising:
preparing the circuit board including the circuit pattern layer;
mounting the semiconductor element on the circuit board;
applying the melt-bonding material on the part of the upper surface of the circuit pattern layer;
arranging, above the circuit board, a lead frame including the connection terminal group;
arranging the lead frame such that the pressing portion presses the circuit board to form a gap between the bonding portion and the circuit pattern layer; and
melting the melt-bonding material.

11. The semiconductor device according to claim 1, wherein
the connection terminal group includes a bonding lead having a connection portion from which each of the bonding portion and the pressing portion extend in a direction orthogonal to a longitudinal direction of the connection portion.

12. The semiconductor device according to claim 1, wherein
a distance between a bottom surface of the bonding portion and the upper surface of the circuit board corresponds to a thickness of the melt-bonding material.

13. The semiconductor device according to claim 2, further comprising:

a power wire electrically connected at one end to another bonding lead and electrically connected at another end to an upper portion of the semiconductor element, or a power wire electrically connected at one end to the bonding lead and electrically connected at another end to an upper portion of another semiconductor element.

14. The semiconductor device according to claim 5, wherein a first distance between a bottom surface of the bonding portion and an upper surface of the circuit pattern layer is less than a second distance between the bottom surface of the bonding portion and an edge of the pressing portion directly contacted with the upper surface of the insulation plate.

15. A lead frame to be bonded to a circuit board on which a semiconductor element is mounted, the circuit board including a circuit pattern layer, and the lead frame comprising:

a connection terminal group formed by including a plurality of leads including a bonding portion to be electrically connected to the circuit pattern layer via a melt-bonding material and a pressing portion to be mechanically and directly contacted with an upper surface of the circuit board at a location spaced apart from the semiconductor element in a width direction of the circuit board, the upper surface of the circuit board being located below a bottom surface of the semiconductor element; and a frame portion configured to support the connection terminal group, wherein, in the connection terminal group, the plurality of leads are adjusted in shape such that when the pressing portion is in direct contact with the upper surface of the circuit board, there is a gap between the bonding portion and the circuit pattern layer.

16. A method for manufacturing a semiconductor device comprising:

preparing a circuit board including a circuit pattern layer and an insulated plate;

mounting a semiconductor element on the circuit board;

applying a melt-bonding material on a part of an upper surface of the circuit pattern layer;

arranging, above the circuit board, a lead frame including a connection terminal group formed by including a plurality of leads including a bonding portion to be electrically connected to the circuit pattern layer via the melt-bonding material and a pressing portion to be mechanically and directly contacted with an upper surface of the circuit board at a location spaced apart from the semiconductor element in a width direction of the circuit board, the upper surface of the circuit board being located below a bottom surface of the semiconductor element;

arranging the lead frame such that the pressing portion presses the insulated plate included in the circuit board to form a gap between the bonding portion and the circuit pattern layer; and melting the melt-bonding material.

* * * * *